(12) United States Patent
Baumgartner et al.

(10) Patent No.: US 7,093,218 B2
(45) Date of Patent: Aug. 15, 2006

(54) INCREMENTAL, ASSERTION-BASED DESIGN VERIFICATION

(75) Inventors: Jason Raymond Baumgartner, Austin, TX (US); Robert Lowell Kanzelman, Rochester, MN (US); Hari Mony, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 323 days.

(21) Appl. No.: 10/782,673

(22) Filed: Feb. 19, 2004

(65) Prior Publication Data

US 2005/0188337 A1    Aug. 25, 2005

(51) Int. Cl.
*G06F 17/50* (2006.01)
*G06F 19/00* (2006.01)

(52) U.S. Cl. .................. 716/5; 716/7; 716/2; 716/3; 703/16

(58) Field of Classification Search .............. 716/5, 716/7, 2, 3; 703/14, 15, 16
See application file for complete search history.

(56) References Cited

U.S. PATENT DOCUMENTS

| | | | | |
|---|---|---|---|---|
| 5,461,574 A | * | 10/1995 | Matsunaga et al. | 716/2 |
| 5,909,374 A | * | 6/1999 | Matsunaga | 716/19 |
| 6,321,363 B1 | * | 11/2001 | Huang et al. | 716/4 |
| 6,408,424 B1 | * | 6/2002 | Mukherjee et al. | 716/5 |
| 6,470,480 B1 | * | 10/2002 | Ganesan et al. | 716/4 |
| 6,480,988 B1 | * | 11/2002 | Ganesan et al. | 716/5 |
| 6,493,852 B1 | * | 12/2002 | Narain et al. | 716/5 |
| 6,532,573 B1 | * | 3/2003 | Kurosaka | 716/5 |
| 6,539,523 B1 | * | 3/2003 | Narain et al. | 716/5 |
| 6,571,375 B1 | * | 5/2003 | Narain et al. | 716/5 |
| 6,581,026 B1 | * | 6/2003 | Lohse et al. | 702/189 |
| 6,611,947 B1 | * | 8/2003 | Higgins et al. | 716/5 |
| 6,625,786 B1 | * | 9/2003 | Ganesan et al. | 716/5 |
| 6,629,297 B1 | * | 9/2003 | Ganesan et al. | 716/5 |
| 6,651,228 B1 | * | 11/2003 | Narain et al. | 716/5 |
| 6,691,287 B1 | * | 2/2004 | Ganesan et al. | 716/4 |
| 6,912,700 B1 | * | 6/2005 | Franco et al. | 716/5 |
| 6,993,734 B1 | * | 1/2006 | Baumgartner et al. | 716/4 |

(Continued)

OTHER PUBLICATIONS

Kwak et al., "Combinational Equivalence Checking Through Function Transformation", IEEE/ACM International Conference on Computer Aided Design, Nov. 10, 2002, pp. 526-533.*

(Continued)

*Primary Examiner*—Phallaka Kik
(74) *Attorney, Agent, or Firm*—Casimer K. Salys; Joseph P. Lally; Anthony V. S. England

(57) ABSTRACT

A design verification system includes a first verification engine to model the operation of a first design of an integrated circuit to obtain verification results including the model's adherence to a property during N time steps of its operation, proofs that one or more verification targets can be reached, and verification coverage results for targets that are not reached. A correspondence engine determines the functional correspondence between the first design and a second design of the integrated circuit. Functional correspondence, if demonstrated, enables reuse of the first engine's verification results to reduce resources expended during subsequent analysis of the second design. The correspondence determination may be simplified using a composite model of the integrated circuit having "implies" logic in lieu of "EXOR" logic. The implies logic indicates conditions in which a node in the second design achieves a state that is contrary to the verification results for the first design.

20 Claims, 5 Drawing Sheets

U.S. PATENT DOCUMENTS

| | | | |
|---|---|---|---|
| 7,028,278 B1* | 4/2006 | Jain | 716/5 |
| 7,032,192 B1* | 4/2006 | Prasad et al. | 716/3 |
| 2002/0065640 A1* | 5/2002 | Ramsey | 703/16 |
| 2002/0112217 A1* | 8/2002 | Ganesan et al. | 716/5 |
| 2002/0116689 A1* | 8/2002 | Ganesan et al. | 716/4 |
| 2002/0116693 A1* | 8/2002 | Ganesan et al. | 716/5 |
| 2002/0120907 A1* | 8/2002 | Ganesan et al. | 716/4 |
| 2002/0133791 A1* | 9/2002 | Cohn et al. | 716/4 |
| 2002/0152060 A1* | 10/2002 | Tseng | 703/17 |
| 2003/0041308 A1* | 2/2003 | Ganesan et al. | 716/4 |
| 2003/0115564 A1* | 6/2003 | Chang et al. | 716/8 |
| 2003/0182641 A1* | 9/2003 | Yang | 716/4 |
| 2004/0015799 A1* | 1/2004 | Jain | 716/5 |
| 2004/0098683 A1* | 5/2004 | Maruyama et al. | 716/5 |
| 2004/0117746 A1* | 6/2004 | Narain et al. | 716/4 |
| 2004/0177332 A1* | 9/2004 | Pandey et al. | 716/5 |
| 2004/0230923 A1* | 11/2004 | Wilcox et al. | 716/2 |
| 2004/0237057 A1* | 11/2004 | Prasad et al. | 716/3 |
| 2005/0010880 A1* | 1/2005 | Schubert et al. | 716/4 |
| 2005/0102647 A1* | 5/2005 | Tsuchiya | 716/18 |
| 2005/0171747 A1* | 8/2005 | Franco et al. | 703/2 |

OTHER PUBLICATIONS

NN77112500, "Structured Sequential Machine Comparison", IBM Technical Disclosure Bulletin, vol. 20, No. 6, Nov. 1997, pp. 2500-2507 (11 pages).*

* cited by examiner

INCREMENTAL, ASSERTION-BASED DESIGN VERIFICATION

BACKGROUND

1. Field of the Present Invention

The present invention relates to the field of integrated circuit design and more particularly to the field of integrated circuit design verification systems.

2. History of Related Art

As the complexity of microprocessors and other large scale integrated circuits has increased over the years, the resources devoted to design verification have accounted for an increasingly large percentage of the total resources required to develop and manufacture such a device. Indeed, verifying the proper furtherality of advanced microprocessors having multiprocessing capability is now estimated to consume more time, labor, and other resources than the actual designing of the device.

Historically, functional verification consisted primarily of generating large numbers of test programs or test cases and running those test programs on a simulator that modeled the device operation. Designers and verification engineers frequently developed such test cases manually with the help of various random and specific test generators. As the number of transistors, furthers, registers, and other facilities in the integrated circuit has increased, conventional verification methods have responded by simply increasing the number of tests that are simulated. Unfortunately, generating a seemingly infinite number of tests is an inefficient and unreliable method of verifying the functionality of all components in a complex circuit.

In the early days of microprocessor development, inefficiencies in functional verification systems were tolerated because the size of the test space (measured, for example, by the number of states the microprocessor may assume) was sufficiently small. In addition, early microprocessors typically had fewer functional units than modern microprocessors, and the interactions between the components and functions were well understood and controlled. The increasing number of functional units in microprocessors is significant from a verification perspective because interaction between functional units can no longer be ignored or only loosely verified by conventional verification methodologies.

The diverse applications in which modern integrated circuits are employed makes it impossible to predict and plan for the type of software applications that will run on them and thus the state and interdependence that will be exercised in the field are rather large and generally non-deterministic. Roughly speaking, the test space of a microprocessor is approximately equal to $2^n$ where n represents the number of latches (state storage devices) within the microprocessor. From this approximation, it will be appreciated that the test space of microprocessors increases exponentially as the number of latches is increased.

The conventional approach to functional verification, in which increased complexity in a device is verified by simply increasing the number of tests that are simulated, is rapidly becoming infeasible. In addition, because the input to a simulator in a conventional verification process is simply a large number of deterministic tests or randomly generated tests, the output of the simulation must be painstakingly evaluated to determine whether a particular simulation was successful in testing the intended functionality of the device.

Adding to the cost and time required to perform functional verification are the inevitable design modifications that are made during the design process. The design of a complex integrated circuit typically evolves many times during its development as new functionality is entered, as design flaws are rectified, as synthesis optimizations are performed on the design to meet timing/size constraints, and as pervasive functions such as test logic are added. Regardless of how small a change is, it is typically necessary to perform the verification process anew every time the design changes unless the change is demonstrated to be extremely trivial. The time required to re-verify a design is particularly limiting when the design change necessitating the re-verification occurs near the end of the design phase (i.e., close to "tape out", "first silicon", or any other significant step in the completion of the design).

It would therefore be desirable to implement a test verification system that addressed the design verification noted above.

SUMMARY OF THE INVENTION

Generally speaking, the present invention contemplates a modular system for verifying the design of an integrated circuit and a unique correspondence checking mechanism. The modular system includes a verification engine or module specifically designed for performing correspondence checking suitable for use following a design change. In conjunction with a modular verification system such as the system disclosed in co-pending patent application of Baumgartner et al. entitled Use of Time Step Information in a Design Verification System, U.S. patent application Ser. No. 10/371,002, filed Feb. 20, 2003 (referred to herein as the '002 application), the incorporation of a correspondence checking module provides a mechanism by which verification results performed on a prior version of a particular design may be re-used to reduce the resources required to verify the design following a design revision. Whereas the '002 application is concerned with using and benefiting from prior verification efforts within a particular design (i.e., no design changes), the present invention extends this concept specifically to encompass design changes.

In one embodiment, the correspondence module may be implemented with an efficient correspondence checking algorithm in which the "EXOR" logic that is conventionally used to verify the correspondence between, for example, a node in an old design and a node in a new design is replaced with "IMPLIES" logic that depends on the type of prior verification data that is being re-applied to the new design (e.g., one type of IMPLIES logic for cases in which a target or node was known to be hit in a prior design and another type of IMPLIES logic for cases which a node in an old design was not hit). The IMPLIES logic is simpler to model (fewer logic elements) and evaluate than conventional EXOR-based correspondence models.

BRIEF DESCRIPTION OF THE DRAWINGS

Other objects and advantages of the invention will become apparent upon reading the following detailed description and upon reference to the accompanying drawings in which.

Figure 1:
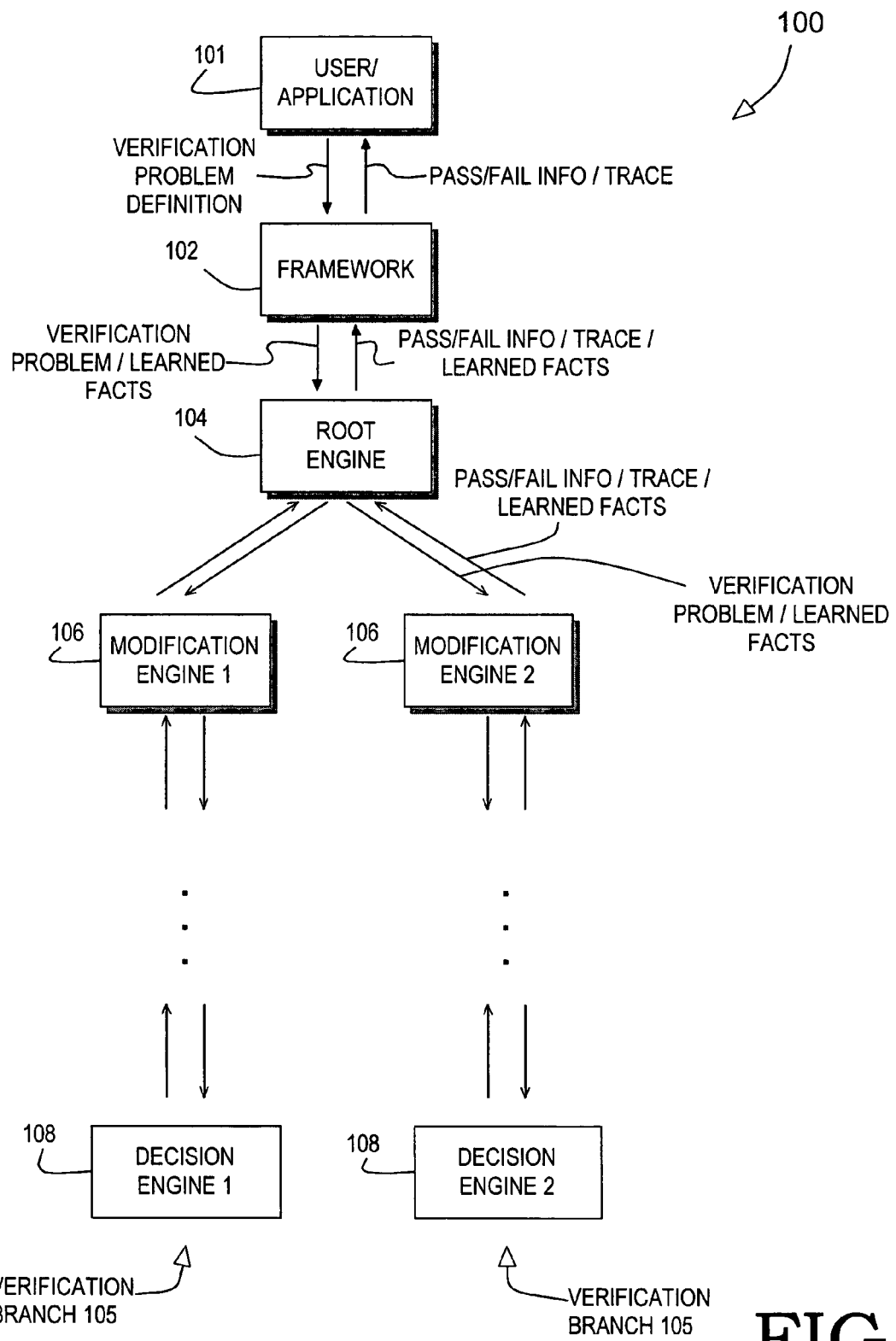
FIG. 1 is a block diagram illustrating a generalized design verification flow according to one embodiment of the invention.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Turning now to drawings, FIG. 1 is a conceptual illustration of selected portions of a design verification system 100 suitable for use with one embodiment of the invention. In the depicted embodiment, system 100 contains many of the same elements as the system 100 described in the '002 application. Thus, for example, system 100 includes a design verification framework 102. Framework 102 includes an interface to communicate with one or more application programs 101 that are invoked by a system user. Framework 102 is further configured to provide a verification problem to a verification engine identified in FIG. 1 as root engine 104. The verification problem typically includes a netlist or another suitable representation of a circuit structure and a set of expected values at one or more of the circuit's nets that are to be proven or disproven. An expected value is proven if a state or sequence of states produces the expected value on the specified circuit net(s).

Framework 102 creates instances of (instantiates) a set of verification engines in one or more sequences typically defined by the user via application program 101. The instantiated engines are typically arranged in a tree-like architecture having one or more verification branches from which other branches may split off. At the apex of this tree structure is a root verification engine 104 that receives a verification problem from framework 102. Framework 102 controls the flow of a verification problem among the verification engines in a branch.

As illustrated in FIG. 1, framework 102 is configured to interact with a user through application program 101 to create one or more verification branches 105, each of which includes a user-defined sequence of one or more verification engines represented in FIG. 1 by reference numerals 104, 106, and 108. Each verification engine is configured to model the operation (state changes) of an integrated circuit and to assess the model's adherence to one or more properties. The verification engines that may be instantiated or invoked by framework 102 include modification engines 106 as well as decision engines 108. As their names suggest, modification engines 106 are configured to modify (and presumably simplify) a given verification problem while decision engines 108 act on a modified or unmodified verification problem to attempt to solve the problem or provide other information about the circuit model. Consistent with the present application's emphasis on verifying design changes, decision engines 108 according to one embodiment of the invention may include a correspondence engine designed to verify the correspondence or equivalence between two models of a particular circuit or design.

Framework 102 applies each of the one or more verification branches 105 to a verification problem. Within each branch 105, the verification problem may be modified by one or more modification engines 106 until, ultimately, the branch terminates with a "leaf" engine representing the last engine on a given branch. The leaf engine is typically a decision engine 108 that attempts to solve a verification problem.

After framework 102 has applied a verification branch 105 to a verification problem, the leaf engine has typically identified at least one counterexample trace for the received verification problem or proved that no counterexample trace is possible, i.e., the problem has been proven correct. Assuming that the leaf engine in a particular branch 105 was successful in a solving particular problem (e.g., the leaf engine has generated at least one counterexample trace or proven the correctness of the problem), it then passes the results (e.g., the discovered trace or the "correct" result) to its parent engine (the engine from which it originally received the verification problem). The parent engine is then responsible for modifying the received results to reflect any modifications to the netlist that it made before it passed the netlist to the leaf engine. After modifying the results accordingly, the parent engine then passes the modified trace to its own parent engine, which further modifies the results to reflect modifications it initiated and so forth until the result is passed from root engine 104 back to the framework 102. In this manner, the results passed back to framework 102 from each of the branches 105 will be consistent with the netlist generated by framework 102.

The verification engines may, during processing of a verification problem, learn certain verification related facts that may make it simpler for other engines to solve the verification problem(s). An engine that learns such a fact typically propagates the learned information to its parent and its children (a child engine is an engine to which an engine passes a verification problem after it has processed the problem- the leaf engine, which is the last child engine in a verification branch, has no child engine). Each of these engines or modules, in turn, will pass the learned information to their respective parents and children. In this manner, the learned information is propagated throughout the tree arrangement. Thus, as illustrated in FIG. 1, the information passed from root engine 104 to each child engine 106 may include a verification problem as well as learned facts about the design. The information passed back from children engine 106 to root engine 104 may include pass/fail information, one or more counterexample traces, and learned facts.

Figure 2:
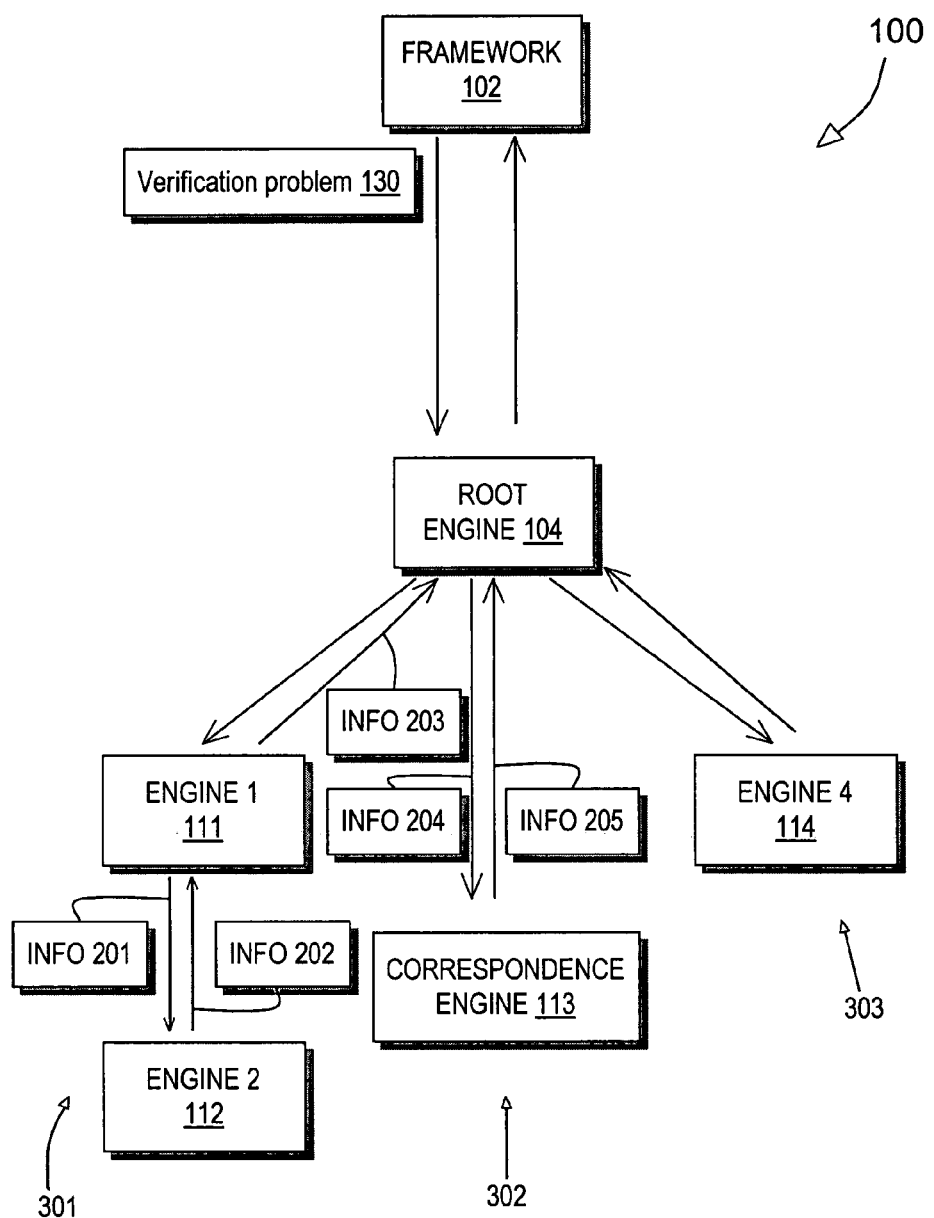
FIG. 2 is a conceptualized design verification system in which specific verification information is conveyed to and from modularized verification engines to simplify or shorten the verification process.

Referring now to FIG. 2, additional details of a modularized embodiment of a design verification system 100 are described. The elements of system 100 illustrated in FIG. 2 include the generation of time step information by some or all of the verification engines and the sharing of this information among the engines in conjunction with the use of a correspondence engine that enables, for example, verification information and time step information extracted from a previous design to be applied to a new or revised design in a manner that is efficient with respect to the operational resources required.

To emphasize these elements, FIG. 2 depicts a framework 102, a root verification engine 104, and a set of four subordinate verification engines identified as Engine 1 (111), Engine 2 (112), Engine 3 (113), and Engine 4 (114). Verification engines 104 and 111 through 114 are invoked to assess a circuit model's adherence to one or more properties, which may be predefined or specified by a user. Each may be implemented as a modification engine or a decision engine as described above. In addition, each verification engine is specifically configured to receive and transmit a form of learned information corresponding to the design being verified that may be used by a subsequent engine to simplify or shorten the verification that it performs.

In one implementation particularly suitable for use in the context of a design change, one of the subordinate verification engines 111 through 114 is a correspondence engine. In this implementation, information shared among the verification engines includes, in addition to the time step information and diameter information described in the '002 application, correspondence information indicative of the furtheral correspondence between a first model of an integrated circuit and a second model of the integrated circuit. Most likely, the first model of the integrated circuit represents a prior or old revision of a design while the second model represent a new revision of the design. The correspondence information is used to determine whether verification results achieved on the old design are applicable to the new design.

Each verification engine may receive time step and diameter information and perform a verification task whether it be a transformation task, a decision task, or a combination thereof. Each such engine may then alter the time step and diameter information if appropriate depending on the verification task performed, and transmit the updated information to the next engine. Each verification engine may use the time step and diameter to eliminate redundant verification processing. Redundant verification processing includes checking for violation of a property during a time step that has been checked previously and ignoring time steps that are "greater than" the maximum number of time steps required to fully verify the design. Moreover, the correspondence engine may be invoked to re-use prior verification efforts by demonstrating the furtheral correspondence of an old design and a new design with respect to the verification test under consideration. Thus, for example, if verification efforts performed on a model of an old design have exhaustively simulated N timesteps, an affirmative correspondence test implies that it is not necessary to verify the first N time steps of the new design. In this way, the correspondence engine enables the reuse of prior verification efforts across design changes.

To illustrate the elements being emphasized in the present disclosure, an exemplary verification process is described in conjunction with the embodiment of system 100 depicted in FIG. 2. Consider a design process in which a design is specified and extensively verified using the modular verification method described in the '002 application including the passing of time step, diameter, and other information among various verification engines to minimize resources consumed verifying a design. Following this extensive verification, the design is altered, either in response to information learned from the verification testing, to add additional functionality, or for any of a number of other reasons.

Frequently, the design change under consideration is minor in the sense that the vast majority of latches and other design features are the same in the prior (old) and the modified (new) designs. In such cases, it is natural to assume that the old and new designs are largely the same from a functional perspective. Unfortunately, the cost associated with introducing a chip that has a furtheral flaw or defect is so significant that chip manufacturers must extensively verify even trivial design changes.

Significant effort has been devoted, therefore, to verifying efficiently the functional equivalence of two similar, but not identical, designs. This type of verification is generally referred to as correspondence checking. Conventional correspondence checking, as described above, is performed by creating a set of correspondence signals where each correspondence signal reflects the value (state) of a composite node that is the EXOR product of a node in the old design and the corresponding node in the new design. If a common set of stimulus are applied to the old and new designs and a correspondence signal is asserted, the furtheral equivalence of the two designs has been negated or disproven for the test under consideration.

One aspect of the present invention improves on the efficiency of conventional correspondence checking by recognizing that verification results are classifiable in two distinct classes, namely, verification results in which a particular signal was asserted or "hit" and verification results in which a particular signal was not hit.[1] Correspondence checking according to the present invention proposes a first type of correspondence logic (in lieu of conventional EXOR logic) for the first class of verification results and second type of logic for the second class of verification results. If a prior verification result demonstrates that a particular node can be hit, the correspondence logic used to verify the functional correspondence of the parallel node in the new design indicates only those conditions in which the old node is asserted and the new node is not (i.e., OLD AND NOT(NEW)). Conversely, if a particular node was not asserted during a prior verification test, the correspondence logic used to verify the functional correspondence of the corresponding node in the new design indicates only those conditions in which the new node is asserted and the old node is not (NOT(OLD) AND NEW).

[1] The latter class of testing results can be further divided into exhaustive cases, where the verification conclusively demonstrates that the signal cannot be asserted under the specified conditions, and inconclusive cases, where the inability to assert the signal is inconclusive. For purposes of the present invention, however, the distinction between exhaustive and "partial" results is largely insignificant.

Figure 3:
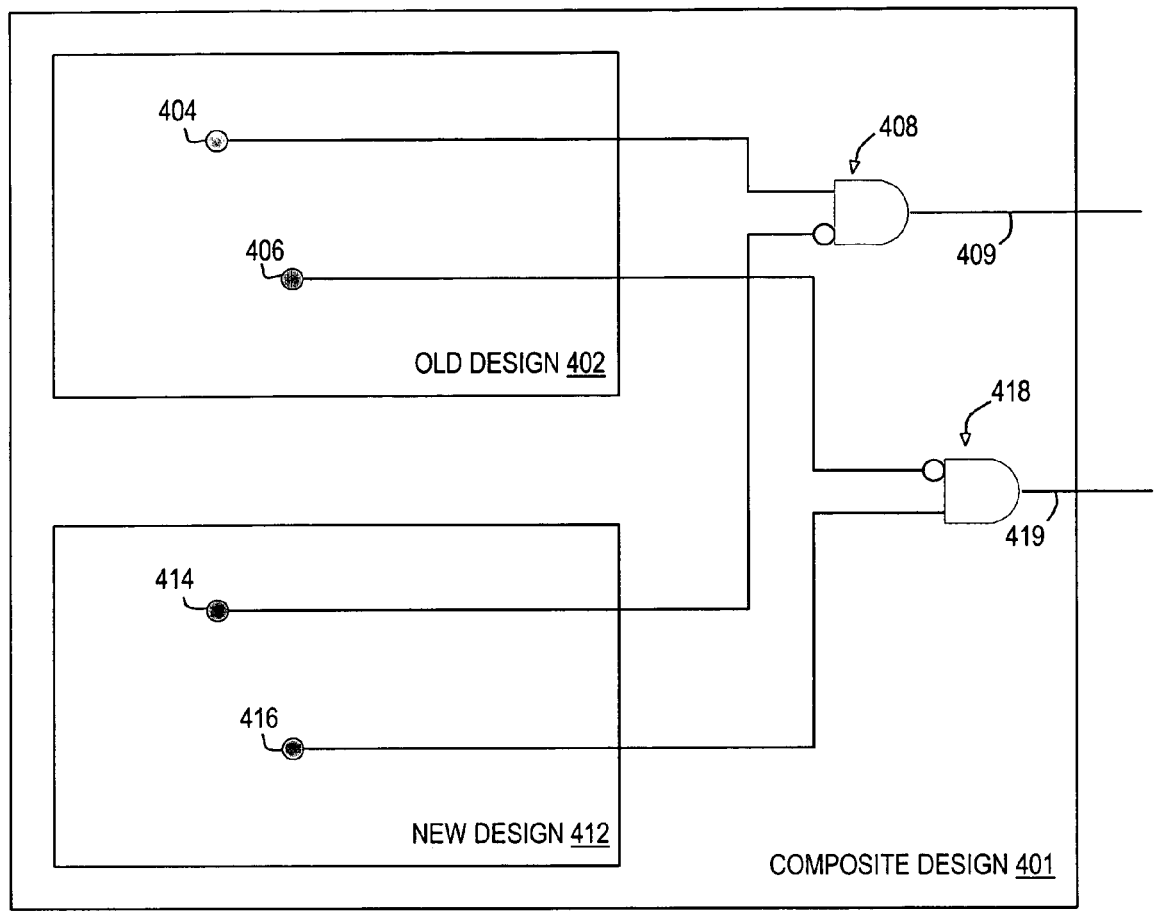
FIG. 3 illustrates IMPLIES logic used in an embodiment of a correspondence checking technique of the present invention.

Referring to FIG. 3, the correspondence logic described above is depicted. As described further below, correspondence checking is achieved by creating a composite design 401 that includes the old design 402 and the new design 412. The creation of composite design 401 preferably includes the determination of corresponding or parallel nodes. In the depicted embodiment, a node 414 in new design 412 is determined to correspond functionally to node 404 in old design 402 and a node 416 in new design 412 is determined to correspond functionally to node 406 in old design 402. Assume further that prior verification efforts, i.e., verification efforts performed on old design 402 (or on a functionally equivalent predecessor of old design 402) demonstrated at least one state in which the node 404 is asserted while the prior verification efforts revealed no states in which node 406 was asserted. Correspondence checking according to the present invention includes creating a first composite node 409 (also referred to as a first correspondence node) using a first type of IMPLIES logic 408 to confirm functional correspondence between node 404 of old design 402 and node 414 of new design 412 and creating a second composite node 419 (also referred to as a second correspondence node) using a second type of IMPLIES logic 418 to confirm the functional correspondence between node 406 of old design 402 and node 416 of new design 412.

If one can prove (using a correspondence algorithm, for example) that first composite node 409, which is the output of the first type of IMPLIES logic 408, cannot be asserted, this indicates that there is no state in which node 404 from old design 402 is asserted (TRUE) and its proposed equivalent node 414 from new design 412 is not asserted (FALSE). Because the prior functional verification work performed on old design 402 proved the existence of a state in which node 404 was asserted, the positive correspondence result implies the existence of a state in new design 412 in which node 414 can also be asserted (TRUE). If it is demonstrated that the second composite node 419, which is the output of the second type of IMPLIES logic 418, cannot be asserted, this result indicates that there is no state of composite design 401 in which node 416 is TRUE and node 406 is FALSE. Because the prior verification effort performed upon old design 402 discovered no states in which node 406 was asserted, the positive correspondence result in this case implies that, if one were to perform equivalent verification upon new design 412, one would not have discovered a state in which node 416 was asserted. Thus, proving that a composite node (e.g., 409 or 419) cannot be asserted saves overall verification time by allowing reuse of results from prior verification work—including results demonstrating that a node can be asserted, that a node can never be asserted, or that a node cannot be asserted for N time-steps—from old design 402 to new design 412. For example, if the prior verification results exhaustively verified 10 time steps from some initial condition and the correspondence engine demonstrates the functional correspondence of the two designs, the prior verification results may be applied to the new design making it unnecessary to re-verify time steps 0 through 9 of the new design, thereby saving potentially considerable verification resources. If, of course, correspondence checking results in the assertion of a composite node (either 409 or 419), the negative correspondence result prevents reuse of the corresponding prior verification results.

Returning now to FIG. 2, an embodiment of modular verification system 100 is depicted where the depicted embodiment emphasizes the incorporation of a correspondence engine into the system. Initially, a verification problem 130 is defined by the framework 102 and provided to root engine 104. Verification problem 130 includes some form of description of a design, a definition of the inputs under consideration, and a definition of a property to be verified. The property to be verified may be expressed as a particular node achieving a particular state. The design description is typically a net list, a VHDL description, or some other suitable description of the design.

Each verification engine 111–114 is configured to receive a verification problem such as verification problem 130 from another engine (the parent engine) and to perform its defined task on the problem when executed or run. In the depicted embodiment, root engine 104 is a parent engine to engines 111, 113, and 114. The defined task for a verification engine could include transformation tasks in which the circuit model or verification task is simplified in some manner and decision tasks in which the existing model is checked within some defined parameters (such as the number of time steps). In addition, the defined task for the depicted embodiment of verification engine 113 is a correspondence task (i.e., the depicted embodiment of verification engine 113 is a correspondence engine).

Each modular verification engine 111–114 is further configured to pass a verification problem to another engine (its child engine) and to receive verification results back from its child when the child has completed its verification processing. Verification results can include counter-example traces, completed proofs that a node can never be asserted, learned facts, and/or time steps verified and design diameter estimation. Each engine 111–114 then passes the received verification results back to its parent. In the depicted embodiment, engine 112 is a child engine relative to engine 111 while engines 113 and 114 as depicted have no child engines. Thus, engine 111 is configured to receive data relating to a verification problem that has been processed by engine 112 and to pass the received data back up to root engine 104.

As suggested previously, in an embodiment in which engine 113 is a correspondence engine, root engine 104 and one or more of engines 111, 112, and 114 may each be configured to pass time step and diameter information among themselves as they pass a verification problem to one another. Similarly, time step and diameter information is propagated from a child engine to its parent. In such an implementation, one or more of the verification engines includes a diameter estimation engine. As described in the '002 application, a diameter estimation engine is an engine that conservatively estimates (i.e., overestimates) an upper bound on the number of time steps that would have to be fully enumerated to formally verify the design. Full enumeration refers to the process of emulating every possible state that a circuit can assume. A time step is fully enumerated when a verification engine evaluates every possible state that the circuit can assume during that time step.

In addition to diameter information, root engine 104 and one or more of engines 111, 112, and 114 may be configured to fully enumerate the integrated circuit model for a predetermined number of time steps. In addition, root engine 104 and each of the verification engines 111–114 are configured to propagate the diameter and time-steps-verified information to and from each other. Thus, each verification engine is configured to receive time step and diameter information that it can use to simplify the verification that it performs. Presumably, each verification engine either "improves" the time step and/or diameter information or leaves it alone. An improvement in time step information is an increase in the number of time steps verified whereas an improvement in diameter information is a decrease in the estimated diameter because it is desirable to increase the number of time steps verified and to reduce the estimate of the maximum number of time steps required.

Each verification engine may use the time step and diameter information to minimize verification resources. As an example, a circuit property can be inferred as correct if the number of exhaustive time steps verified exceeds the estimated diameter. The number of time steps exhaustively verified can include a forward time steps component and a backwards time steps component. In this case, it is only necessary that one of the component time steps exhaustively verified exceeds the estimated diameter. Another example of verification resource reduction occurs when an exhaustive search algorithm is invoked. The algorithm need not check for the truth or falsity of a specified property during the time steps already checked (i.e., during time steps with values that are less than the greater of the time steps forward information and the time steps backward information). Thus, if 6 time steps have been exhaustively verified forwards while 10 time steps have been exhaustively verified backwards, a subsequent engine need not verify circuit properties during time steps 0 through 9.

Returning to the specific embodiment depicted in FIG. 2, framework 102 transmits a verification problem in which the DIAMETER is estimated as VERY LARGE (e.g., $2^R$) and the forward (FWD) and backward (BCK) TIME STEP parameters are initialized to 0. As each engine in system 100 is invoked, it will internally update its record of these three parameters as appropriate. When an engine subsequently passes the problem to a child engine, the parent engine will propagate the current values of the parameters to the child. Similarly, when an engine receives verification data (including these three parameters) back from its child, it will update its internal values for these parameters appropriately (i.e., to record the DIAMETER reported by the child if that value is smaller than its previously-held value, and to record the FWD and BCK TIME STEP values reported by the child if those values are larger than their previously held values). The engine will then propagate any improvements in these parameters (lower DIAMETER, higher FWD or BCK TIME STEP) up to its parent (root engine 104 in the depicted example). Ultimately, the framework 102 will archive the best determined values for the parameters. If a subsequent run is executed, the execution will start with the archived parameter values as the initial values.

In the embodiment depicted in FIG. 2 emphasizing verification in the context of a design change, the left most verification branch 301 (the branch including engines 111 and 112) represents a first "run" of the system that is executed with respect to a first revision of a particular design also referred to herein as the old design. The middle verification branch 302 represents a second run of the system. Branch 302 is a correspondence verification branch including correspondence engine 113 that is invoked after the first revision of the design has been changed to a second revision of the design (the new design). The purpose of middle verification branch 302 is to determine whether the verification results achieved with respect to the old design (the results achieved by first verification branch 301) are applicable to the new design and preferably making this determination using considerably less verification resources than would be required simply to re-perform verification branch 301 on the new design. The right-most verification branch 303 represents a third run of the system during which additional verification (verification coverage in addition to the coverage achieved by the left-most verification branch 301) is achieved.

The process depicted in FIG. 2 may be described qualitatively as follows. Often, one will perform extensive verification on the design using, for example, the system described in the '002 application. All of this "prior" verification work is represented in FIG. 2 by branch 301. The results of this verification (time-step information, traces, proofs of correctness, etc.) are then archived. After the design changes, one will perform a "correspondence-check" represented by branch 302 and try to prove that the correspondence logic is not assertable. If this proof succeeds, then the past verification results can be applied directly from the old design to the new design. More specifically, the old results can be re-applied for any node for which the correspondence check proved that the associated correspondence logic could not be asserted. With respect to all other correspondence logic (i.e., correspondence logic that was not conclusively proven to be un-assertable) the old results cannot be re-applied. After completion of the correspondence check, the branch 303 represents additional verification testing performed on the new design preferably using a system such as that described in the '002 application.

If, for example, verification engine 111 is a transformation engine that performs a bounded backward exhaustive search on the old design for 6 time steps. The backwards search is performed in an effort to assess the incorrectness of a property during its transformation. Assuming that the problem is not solved within the 6 time steps, the circuit model output from verification engine 111 is passed to its child, verification engine 112, along with INFO 201. At this point, INFO 201 indicates that the maximum number of backwards time steps is 6, while the number of forward time steps and diameter still retain their default (initial) values of 0 and $2^R$ respectively.

Engine 2 (112) may be a verification engine that performs a bounded exhaustive forward search for 20 time steps. While performing this verification processing, Engine 2 (112) makes use of INFO 201 by not checking for property violations during its enumeration of time steps 0 through 5. If Engine 2 (112) is unable to prove or disprove a property within its 20 time steps, it updates the time step information with 20 as the number of time steps forward and passes this information back to Engine 1 (111) as INFO 202, where FWD is 20, BCK is 6, and the estimated diameter is still $2^R$. Engine 1 (111) propagates INFO 203 back to root engine 104 where INFO 203 is the same as INFO 202.

After a design change is made, root engine 104 then passes a snapshot of the old design (included in INFO 204) to correspondence engine 113. Information 204 may include data indicating which targets or nodes were hit in the old design, any available debug traces showing hit nodes on the old design, which nodes were not hit, and coverage data for the un-hit nodes. Information 204 further includes a model of the new design and likely includes any timestep and diameter information determined for the old design in verification branch 301.

Figure 4:
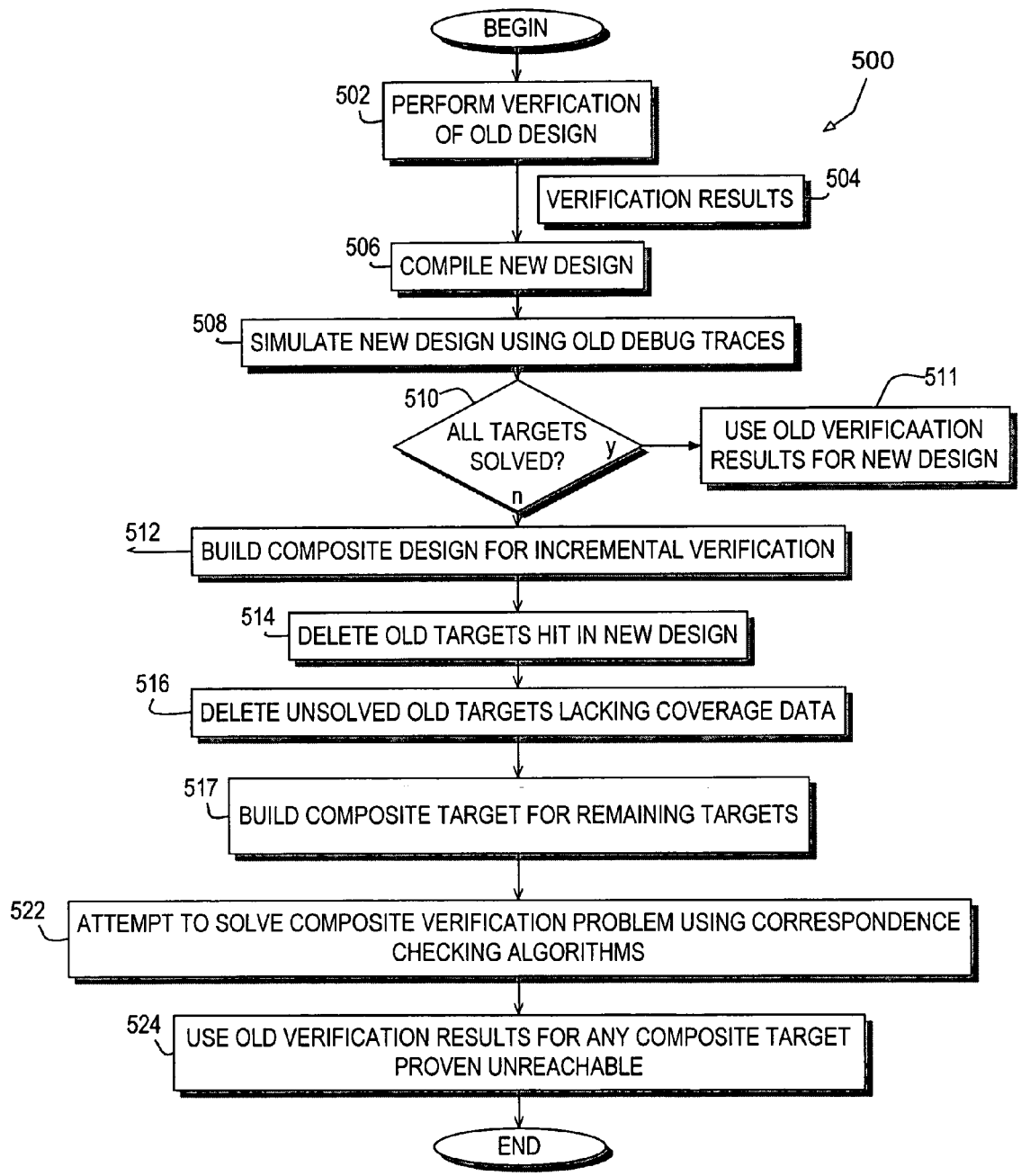
FIG. 4 is a flow diagram of a correspondence checking process according to one embodiment of the present invention.

As described further below with respect to FIG. 4, one embodiment of correspondence engine 113 uses the old design snapshot and the model of the new design to create a composite model that includes the old design and the new design. The composite model includes correspondence signals designed to indicate discrepancies between corresponding targets or nodes of the two designs. Correspondence engine 113 then returns a result (INFO 205) that indicates whether the verification results achieved by verification branch 301 are valid for the new design. If verification engine 113 determines that the prior verification results are valid, the prior results including any timestep and diameter information determined in verification branch 301 are forwarded to and used by verification branch 303.

Portions of the invention may be implemented as a set of computer executable instructions (i.e., software) stored on a computer readable medium such as a dynamic or static RAM element, a non-volatile medium such as a magnetic disk, CD ROM, floppy diskette, flash memory, magnetic tape, and so forth. In one such implementation, various portions of the software, when executed, perform the integrated circuit design verification processing depicted in FIG. 2 including design verification processing as described in the '002 application. With respect to the present invention's emphasis on verification across design changes, the software may include correspondence verification software that, when executed, executes a correspondence verification process or method 500 depicted in the flow diagram of FIG. 4.

In the depicted embodiment, process 500 includes, as a preliminary step, performing (block 502) design verification on a first revision of a design (the old design). This processing represents the verification processing 301 depicted in FIG. 2. Verification processing 502 produces verification results 504. Thereafter, a second revision of the design (the new design) is created by performing one or more revisions to the old design. The new design is then compiled (block 506) and all verification data for the new design is cleared.

In the depicted embodiment of correspondence verification method 500, any debug traces discovered during verification of the old design are simulated (block 508) on the new design to achieve some quick coverage. Under the assumption that the two designs are substantially similar and functionally equivalent or close thereto, debug traces that hit nodes on the old design are likely to hit the corresponding nodes on the new design. If such nodes are hit, simulating the prior design debug traces is efficient in discovering hit nodes on the new design. If, on the other hand, one or more of the old design debug traces do not produce hit nodes, simulation of the prior design verification is efficient in disproving correspondence between the two designs.

If simulation of the old debug traces resolves, as determined in block 510, all nodes under consideration, the old verification results are applied to the new design (block 511). If one or mode nodes remain unresolved after block 508, a composite model including the old design and the new design is created (block 512). The composite model may use EXOR logic over corresponding nodes as is traditional with equivalence checking or, in a preferred embodiment, will use IMPLIES logic instead of EXOR logic for the correspondence checking.

Once the composite model is created, some model simplifications may be made based upon the coverage achieved in block 508 when the old debug traces were simulated on the new design. Specifically, any old design nodes that were hit in the new design in block 508 may be removed (block 514) from the circuit model (because the ability to hit the node in the new design has been demonstrated). In addition, simplification of the composite design may be achieved by eliminating (block 516) from the composite design any old design nodes for which no verification coverage was achieved since incremental verification of such nodes would be meaningless.

Figure 5:
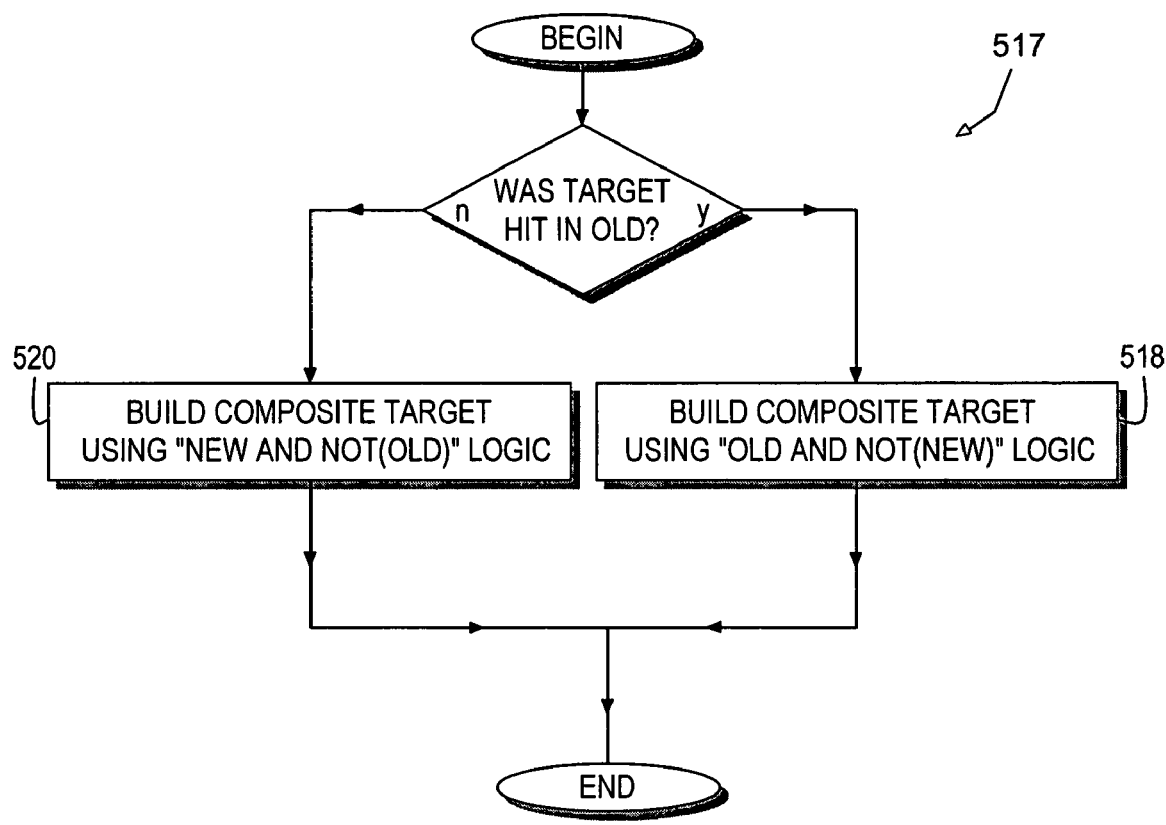
FIG. 5 illustrates details of the flow diagram of FIG. 4 according to one embodiment of the invention.

Following simplification of the composite model, composite targets are created or built (block 517) for all targets that remain after simplification. Each composite target is designed to indicate functional differences between a node or target in the old design and the corresponding node or target in the new design. Composite targets may be implemented with traditional EXOR logic. Alternatively, as depicted in FIG. 5, the generation (517) of composite targets may use the IMPLIES logic, as described above with respect to FIG. 3, to generate composite or correspondence signals. In this embodiment, block 517 includes creating (block 518) a composite node for any nodes that remain after block 516 that were hit in the old design using an OLD AND NOT (NEW) type of IMPLIES logic represented by reference numeral 408 in FIG. 3. Next, a composite node is created (block 520) for any nodes remaining after block 516 that were not hit in the old design using a NOT(OLD) AND NEW type of IMPLIES logic represented by reference numeral 418 in FIG. 3.

Returning to FIG. 4, with the correspondence targets created, correspondence verification is then performed (block 522). Preferably, correspondence checking using the composite model is performed using an efficient correspondence checking algorithm. While the size of the composite design 401 (FIG. 3) in terms of the number of latches or potential state, is essentially twice the size of the old or new design, correspondence algorithms exist that are able to efficiently discharge the correspondence problem. Various known combinational equivalence checking algorithms, for example, are able to perform equivalence checking very efficiently. This is particularly true when the old and new designs are very close to identical, which is frequently an appropriate assumption in the context of a mature design when design changes tend to be minor.

Following completion of the correspondence checking problem, any correspondence signals (such as the output signals from the IMPLIES logic 408, 418 in FIG. 3) that have been proven to be unreachable (i.e., the signal was never asserted), any old verification results pertaining to the signal in the old design can be applied (block 524) to the corresponding signal in the new design. In this manner, method 500 is able to determine the equivalence between two versions of a design. Because the preferred embodiment of method 500 uses IMPLIES logic that is less complex and easier to evaluate than the EXOR logic typical of conventional correspondence models, the method 500 is better able to solve the correspondence problem.

It will be apparent to those skilled in the art having the benefit of this disclosure that the present invention contemplates a method and system for verifying the design of an integrated circuit. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A design verification system, comprising:
   a first verification engine configured to model an operation of a first design of an integrated circuit and to assess the model's adherence to a property during N time steps of its operation;
   means for recording and propagating a value of N;
   a correspondence engine configured to determine a functional correspondence between the first design of the integrated circuit and a second design of the integrated circuit; and
   responsive to the correspondence engine determining the functional correspondence of at least one node of the first design and a corresponding node of the second design, means for using the propagated value of N to reduce resources expended during subsequent analysis of the second design of the integrated circuit, wherein the subsequent analysis verifies the second design's adherence to the property during time steps greater than N.

2. The system of claim 1, wherein using the propagated value of N to reduce resources expended includes applying verification results achieved by the first verification engine to each of the nodes in the second design determined to have functional correspondence to a respective node in the first design.

3. The system of claim 2, wherein the correspondence engine is configured to determine functional correspondence between a node in the first design and a corresponding node in the second design includes creating a composite model including a composite node having a state determined by the state of the node in the first design and the respective node in the second design and monitoring the composite node, wherein assertion of the composite node negates the functional correspondence between the nodes in the first and second designs.

4. The system of claim 3, wherein the correspondence engine is further configured to simulate a new design using any debug traces for an old design and to simplify the composite model by eliminating any nodes in the new design that were bit during the simulation and removing any composite nodes corresponding to old design nodes for which no coverage was achieved.

5. The system of claim 4, wherein determining functional correspondence between a node in the first design and the corresponding node in the second design includes creating an EXOR node having a value of an exclusive or product of the node in the first design and the node in the second design when a common set of inputs are applied to the first and second designs.

6. The system of claim 4, wherein the node in the first design was shown to be hit by the first verification engine and wherein determining functional correspondence between a node in the first design and the corresponding node in the second design further includes creating an IMPLIED node that is asserted if and only if the node in the first design is ASSERTED and the corresponding node in the second design is NOT ASSERTED when a common set of inputs is applied to the first and second designs.

7. The system of claim 4, wherein the node in the first design was not shown to be hit by the first verification engine and wherein determining functional correspondence between a node in the first design and the corresponding node in the second design further includes creating an IMPLIED node that is asserted if and only if the node in the second design is ASSERTED and the corresponding node in the first design is NOT ASSERTED when a common set of inputs is applied to the first and second designs.

8. A computer program product comprising a computer readable medium for verifying a design of an integrated circuit, comprising
   first verification engine code means to model an operation of a first design of an integrated circuit and to assess the model's adherence to a property during N time steps of its operation;
   code means for recording and propagating a value of N;
   correspondence code means for determining a functional correspondence between the first design of the integrated circuit and a second design of the integrated circuit; and
   code means, responsive to the correspondence engine determining the functional correspondence of at least one node of the first design and a corresponding node of the second design, for using the propagated value of N to reduce resources expended during subsequent analysis of the second design of the integrated circuit, wherein the subsequent analysis verifies the second design's adherence to the property during time steps greater than N.

9. The computer program product of claim 8, wherein the code means for using the propagated value of N to reduce resources expended includes code means for applying verification results achieved by the first verification engine to each of the nodes in the second design determined to have functional correspondence to a respective node in the first design.

10. The computer program product of claim 9, wherein the code means for reducing the resources expended further includes omitting property violation checks when enumerating states of the second design of the integrated circuit for time steps less than N.

11. The computer program product of claim 8, wherein the code means for determining functional correspondence between a node in the first design and a corresponding node in the second design includes code means for creating a composite node having a state determined by the state of the node in the first design and the respective node in the second design.

12. The computer program product of claim 11, wherein the node in the first design was shown to be hit by the first verification engine and wherein the code means for determining functional correspondence between a node in the first design and the corresponding node in the second design further includes code means for creating an IMPLIED node that is asserted if and only if the node in the first design is ASSERTED and the corresponding node in the second design is NOT ASSERTED when a common set of inputs is applied to the first and second designs.

13. The computer program product of claim 11, wherein the node in the first design was not shown to be hit by the first verification engine and wherein the code means for determining functional correspondence between a node in the first design and the corresponding node in the second design further includes creating an IMPLIED node that is asserted if and only if the node in the second design is ASSERTED and the corresponding node in the first design is NOT ASSERTED when a common set of inputs is applied to the first and second designs.

14. The computer program product of claim 11, wherein the code means for determining functional correspondence between a node in the first design and the corresponding node in the second design further includes creating an EXOR node having a value of an exclusive or product of the node in the first design and the node in the second design when a common set of inputs are applied to the first and second designs.

15. A design verification system, comprising:
   means for creating a composite of a first design of an integrated circuit and a second design of the integrated circuit;
   wherein the composite design includes at least one correspondence node having a state determined by the state of a node in the first design and a corresponding node in the second design;
   wherein the correspondence node exhibits an IMPLIED relation to the nodes in the first and second designs, wherein the correspondence node is asserted when the node in the first design exhibits a state that was verified in a prior verification while the corresponding node in the second node was not verified; and means for determining if the correspondence node is capable of being asserted.

16. The system of claim 15, wherein the correspondence node is asserted if and only if the node in the first design is TRUE and the corresponding node in the second design is NOT (TRUE).

17. The system of claim 15, wherein the correspondence node is asserted if and only if the node in the first design is NOT (TRUE) and the corresponding node in the second design is TRUE.

18. The system of claim 15, further comprising means for receiving a verification result from a first verification engine configured to model a behavior of at least a first node of the first design and means for applying the verification result to a first node of the second design if the correspondence node is determined to be incapable of being asserted.

19. The system of claim 18, wherein the first verification engine verifies the behavior of the first node of the first design for N timesteps.

20. The system of claim 19, wherein applying the verification result to the first node of the second design includes ignoring property checking of the first node of the second design during the first N time steps.

* * * * *